(12) United States Patent
Leonardi

(10) Patent No.: US 6,900,504 B2
(45) Date of Patent: May 31, 2005

(54) INTEGRATED STRUCTURE EFFECTIVE TO FORM A MOS COMPONENT IN A DIELECTRICALLY INSULATED WELL

(75) Inventor: Salvatore Leonardi, Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/442,646

(22) Filed: May 21, 2003

(65) Prior Publication Data

US 2004/0021169 A1 Feb. 5, 2004

(30) Foreign Application Priority Data

May 22, 2002 (IT) .................................. MI2002A001098

(51) Int. Cl.⁷ ............................................. H01L 31/0392
(52) U.S. Cl. ..................................... 257/354; 257/347
(58) Field of Search ................................ 257/354, 349, 257/353, 347, 348, 352

(56) References Cited

U.S. PATENT DOCUMENTS 6,268,630 B1 * 7/2001 Schwank et al. ............ 257/347
6,455,902 B1 * 9/2002 Voldman ..................... 257/378
6,657,257 B2 * 12/2003 Ohyanagi et al. ........... 257/347

* cited by examiner

Primary Examiner—Eddie Lee
Assistant Examiner—Douglas W. Owens
(74) Attorney, Agent, or Firm—Lisa K. Jorgenson; Allen, Dyer, Doppelt, Milbrath & Gilchrist, P.A.

(57) ABSTRACT

The integrated structure and process is effective to form, in a dielectrically insulated well, a MOS component including respective drain and source regions of a first conductivity type as well as a gate region. The integrated structure includes a cut-off layer of the second conductivity type effective to surround only the source region. The cut-off layer is self-aligned by the gate region.

10 Claims, 7 Drawing Sheets

INTEGRATED STRUCTURE EFFECTIVE TO FORM A MOS COMPONENT IN A DIELECTRICALLY INSULATED WELL

FIELD OF THE INVENTION

The present invention relates to an integrated structure and associated process to form a MOS component in a dielectrically insulated well. More specifically, the invention relates to an integrated structure, in a dielectrically insulated well, forming a MOS component with respective drain and source regions of a first conductivity type as well as a gate region.

BACKGROUND OF THE INVENTION

The integration of an N-channel MOS component by using a dielectrically insulated well formed from a SOI (Silicon On Insulator) substrate is well known. Particularly, the SOI substrate defines a vertical dielectric insulation, whereon convenient dielectric trenches are formed, effective to define a side dielectric insulation, thus forming a dielectrically insulated well. With reference to FIGS. 1A and 1B an integrated structure 11 forming an N-channel MOS or NMOS component in a dielectrically insulated well is described hereafter. Particularly, FIGS. 1A and 1B represent the layout and the cross section of the integrated structure 11 respectively.

The integrated structure 11 includes a substrate 1 of a first dopant type, particularly of the N type, whereon a buried oxide layer 2 is formed, which forms the vertical dielectric insulation of a dielectrically insulated well 3 of a second dopant type, particularly of the P type. Particularly, the dielectrically insulated well 3 is formed in a silicon layer 4, defined as silicon on-insulator or SOI of the first N-dopant type through dielectric trenches 5 forming the side dielectric insulation of the well 3.

Dielectric trenches 5 can be formed conventionally by using for example dielectric walls 12 filled in with a convenient filler 13, for example polycrystalline silicon. The dielectrically insulated well 3 is a P-region and it is the bulk region of the NMOS component formed in the integrated structure 11. Respective N-regions 6A and 6B are provided in this dielectrically insulated well 3, which are effective to form the NMOS component drain and source regions, and thereon a structure effective to form the NMOS component gate terminal is provided in correspondence with a gate region 7. The NMOS component is thus completed by growing a thick oxide 8 delimiting NMOS component active areas, and depositing a surface dielectric 9 covering the thick oxide 8 and the gate structure, as well as finally depositing a metallization 10.

The substrate 1 serves as mechanical support during the NMOS component manufacturing steps. It is worth noting that the dielectrically insulated well 3, forming the bulk region of the P-type wherein the NMOS component is integrated, is thus completely dielectric-surrounded, particularly the buried oxide 2 and dielectric trenches 5. In practice, an excess of positive charge in dielectric regions 2 and 5 surrounding the NMOS component dielectrically insulated well 3 (with respect to a commonly accepted value) lets preferred bulk or side conduction channels to be formed along the walls of dielectric trenches 5, schematically indicated with arrows F in FIG. 1B. These preferred conduction channels can be electrically detected as undesired leakage currents being present between the NMOS component source and drain regions, independently from the bias value and type (positive or negative) of the gate region 7. It is worth noting that these excessive positive charges can be inserted in the dielectric during the working steps or stocked therein during ionizing radiation exposure periods, as it happens for example with devices for nuclear or space applications.

The traditional integrated structure 11 effective to form an NMOS component in a dielectrically insulated well 3 is thus intrinsically subject to the formation of parasitic elements, particularly the preferred conduction channels in the dielectrically insulated well 3, of the NMOS type as well. The formation of these preferred NMOS parasitic channels and related undesired leakage currents is known to be eliminated by integrating around the NMOS component a heavily P-doped surface layer, the so-called guard-ring. Particularly, as schematically shown in FIGS. 2A and 2B, an integrated structure 20 effective to form such an NMOS component comprises, in contact with the NMOS component dielectrically insulated well 3, a ring cut-off region 14 located between dielectric trenches 5 and regions 6A and 6B, as well as a further thick oxide area 15 grown between the ring cut-off region 14 and the drain and source regions 6A and 6B. FIGS. 2A and 2B represent the layout and the cross section of the integrated structure 20 respectively. The ring cut-off region 14 is a heavily-doped region effective to cut off the formation of surface or bulk channels, near the interface between the well 3 and the dielectrically insulated regions 6A and 6B.

This first known approach, though advantageous for the cut-off of possible NMOS parasitic channels, involves however greater dimensions in terms of integration area. In fact, for a correct electric operation of the NMOS component formed via the integrated structure 20, the ring cut-off region 14 must be kept at a minimum distance from the drain region 6A. This minimum distance is particularly a function of the nominal breakdown voltage required for the NMOS component. It is also worth noting that the ring cut-off region 14, besides being heavily doped, must be formed so as not to be excessively diffused in order to reduce the overall occupation area of the NMOS component formed by the integrated structure 20.

The parameters indicated, i.e. the heavy doping and the reduced diffusion required for the ring cut-off region 14, constrain the integration of this region 14 in a final step of the process sequence for integrating the structure 20, particularly after the gate polysilicon layer integration step, to limit the thermal cycles undergone by this region 14. This involves also gate structure layout constraints, such as for example the contact region definition or the contact resistance minimization. Finally, the implementation of the ring cut-off region 14 in dielectrically insulated wells 3, besides the integration area increase, involves also the change in traditional integration architectures, mainly when integrating high integration density circuits, such as CMOS logic circuits.

Drain and source regions 6A and 6B are also known to be spaced from the thick oxide 8 delimiting the active area, as in the integrated structure 30 schematically shown in FIGS. 3A and 3B which represent the layout and the cross section of the integrated structure 30 respectively. In the NMOS component active area formed by via the integrated structure 30, the thick oxide 8 and the drain and source regions 6A and 6B are thus separated by a dielectric region 16 whose oxide thickness, commonly indicated as VAPOX, is thinner than the thickness of the whole dielectrically insulated well 3 composed of the so-called LOCS and VAPOX oxides.

The integrated structure 30 prevents thus surface channels from being formed between the drain and source regions 6A and 6B outside the gate region 7, which are generated by the positive charge trapping phenomenon in the thick oxide 8. This is for example the case when an NMOS component undergoes a ionizing radiation. In fact it is worth remembering that the ionizing radiation on a semiconductor device causes the formation of electron-hole couples in the whole device volume undergoing the radiation. Particularly, the holes (being positive charges), differently from electrons, are trapped in oxide layers and they can produce an image charge on silicon layers forming subsequently surface channels and leakage. Since the amount of charge trapped is exponentially proportional to the thickness of the oxide layer containing it, this phenomenon is very relevant near the so-called LOCO oxidation regions which are thus particularly sensitive to this effect.

The integrated structure 30 conventionally formed by spacing drain and source regions 6A and 6B is structurally less effective than an integrated structure 20 comprising a ring cut-off region 14. Moreover, such a structure is not very effective in terms of integration area occupation.

The thickness of the dielectric affected by the leakage phenomenon is also known to be reduced by integrating, on the active area, polysilicon or metallization regions, conveniently biased so as to cut off or anyway not favor the surface channel formation. However such approaches damage the so-formed NMOS component occupation area and they also involve structural constraints linked to the polysilicon or metallization region integration with respect to the junctions or edge structures allowing the so-integrated NMOS component voltage seal.

The technical problem underlying the present invention is the provision of an integrated structure effective to form a NMOS component in a dielectrically insulated well having such structural and functional characteristics as to overcome the limits and drawbacks still affecting prior art integrated structures.

SUMMARY OF THE INVENTION

An object of the present invention is to integrate a protection structure effective to avoid the formation of a parasitic component being intrinsic to the dielectrically insulated NMOS component structure only in correspondence with the source region.

On the basis of this object, the present invention provides an integrated structure effective to form in a dielectrically insulated well a MOS component comprising respective drain and source regions of a first conductivity type, as well as a gate region, and including a cut-off layer of the second conductivity type effective to surround only the source region and to contact the gate region.

The invention also includes an integration process of a MOS component in a dielectrically insulated well comprising the steps of: forming a SOI substrate of a first dopant type; forming the dielectrically insulated well of a second dopant type by defining and integrating in the SO substrate a side insulation structure of the dielectrically insulated well, as well as masking, development and implant steps of the second dopant type; defining an active region of the MOS component; and defining respective gate, drain and source regions of the MOS component. The source region is defined through an asymmetric masking with respect to the gate region and in that it further comprises a step of forming a cut-off layer effective to surround the source region.

BRIEF DESCRIPTION OF THE DRAWINGS

The features and advantages of the integrated structure and integration process according to the invention will be apparent from the following description of embodiments thereof given by way of non-limiting example with reference to the attached drawings.

DETAILED DESCRIPTION OF THE PREFERRED EMBODIMENTS

Figure 4A:
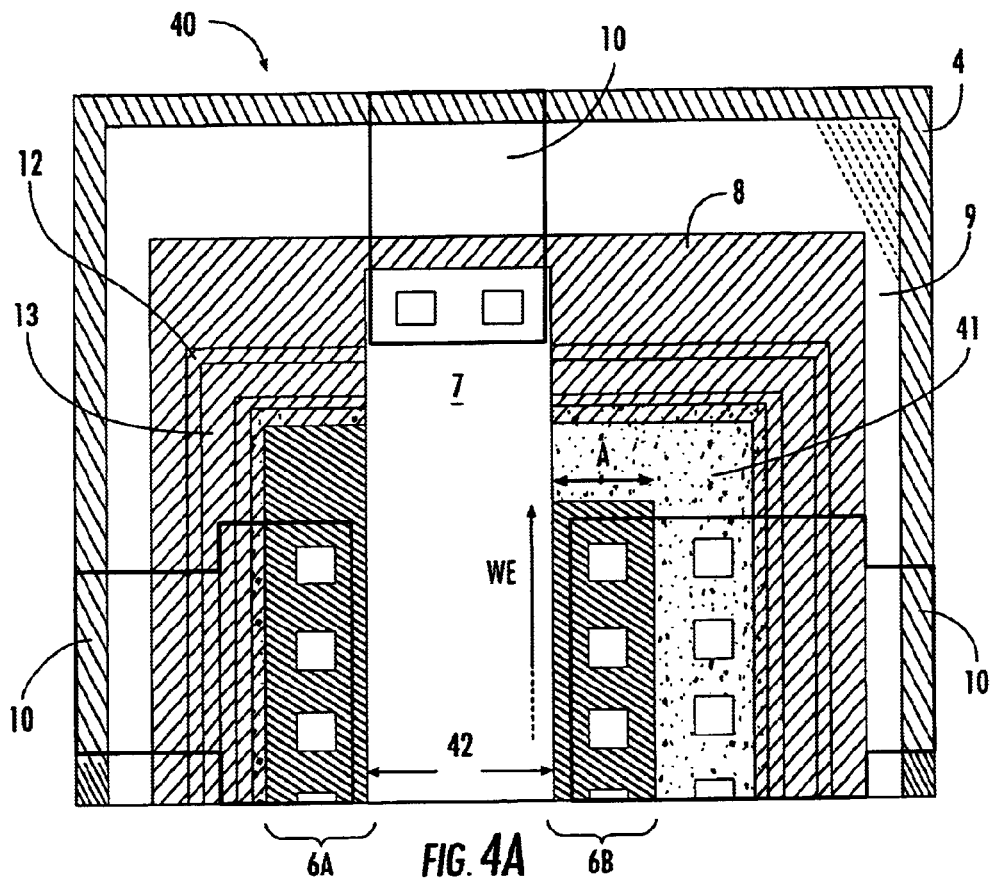
FIGS. 4A and 4B are schematic integration layout and corresponding cross-sectional views respectively showing an integrated structure forming an NMOS component in a dielectrically insulated well according to the present invention.
Figure 4B:
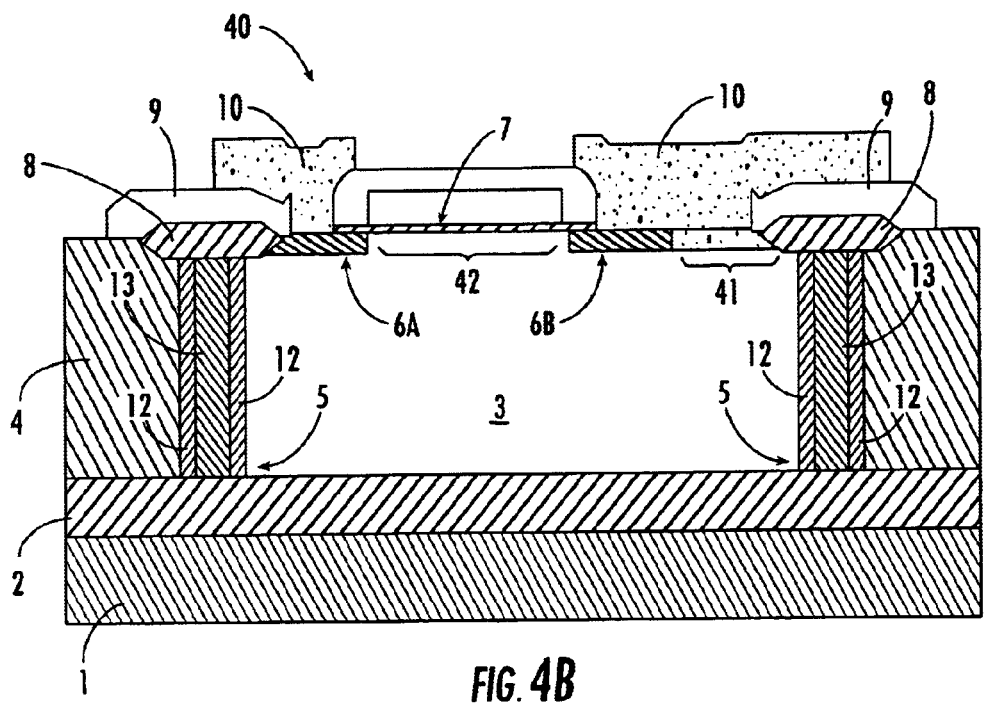

With reference to the drawings, and particularly to FIGS. 4A and 4B, an integrated structure effective to form an NMOS component in a dielectrically insulated well is globally and schematically indicated with 40. Particularly, FIGS. 4A and 4B are the layout and the cross section of the integrated structure 40 respectively. Elements being structurally and functionally similar to prior art integrated structures have been given the same numeral references for simplicity and clarity of illustration. Moreover, the cross sections represented in the drawings are not drawn to scale but so as to show the important features of the integrated structure according to the invention.

Finally, reference will be made hereinafter to process steps not forming a complete process flow for the integrated circuit manufacture. The present invention can be implemented by using the integrated circuit manufacturing techniques presently used in the field, being comprised in the description only the process steps which are necessary to understand the present invention.

As seen with reference to the prior art, the integrated structure 40 according to the invention comprises a substrate 1 of a first dopant type, particularly of the N type, whereon a buried oxide layer 2 is formed, which forms the vertical dielectric insulation of a dielectrically insulated well 3 of a second dopant type, particularly of the P type. Particularly, the dielectrically insulated well 3 is formed in a SOI silicon layer 4 of the first N dopant type via dielectric trenches 5 forming the side dielectric insulation of the well 3. Dielectric trenches 5 can be conventionally formed by using for example dielectric walls 12 filled with a convenient filler 13, for example polycrystalline silicon.

The dielectrically insulated well 3 is a P-region and it is the bulk region of the NMOS component formed in the integrated structure 11. In this dielectrically insulated well 3 respective N-regions 6A and 6B are provided, which are effective to form the NMOS component drain and source regions, and thereon a structure is provided, being effective to form the NMOS component gate terminal in correspondence with a gate region 7. The NMOS component is thus completed by growing a thick oxide 8 delimiting NMOS component active areas, and by depositing a surface dielectric 9 covering the thick oxide 8 and the gate structure, as well as by finally depositing a metallization 10.

Advantageously according to the invention, the source region 6B of the NMOS component formed via the integrated structure 40 is laterally surrounded by a cut-off layer 41 of the second conductivity type, particularly of the P type, being self-aligned to the gate region 7. In other words, the cut-off layer 41 is substantially C-shaped surrounding on three sides the source region 6B, particularly with a shorter side whose size does not exceed the amplitude A of the source region 6B in the same direction.

Therefore, advantageously according to the invention, the cut-off layer 41 does not reach the channel active region 42. This cut-off layer 41 is in direct contact with dielectric trenches 5, completely insulating the source region 6B. In fact, the source region 6B dimensions in correspondence with the channel active region 42 are reduced so that the overall dimensions of this source region 6B and of the cut-off layer 41 correspond to the dimensions of the drain region 6A in correspondence with this channel active region 42. Therefore the source region 6B is not in contact with the corresponding dielectric trench 5 and it is insulated therefrom.

The cut-off layer 41 is a heavily doped layer integrated in direct contact with the source region 6B so as to serve also as bulk contact for the dielectrically insulated well 3 wherein the NMOS component is formed. Advantageously according to the invention, the presence of the cut-off layer 41 around the source region 6B allows thus the formation of possible parasitic bulk or side channels along dielectric trench 5 walls to be cut-off. In fact, any preferred conduction channel of the N-type, which might be formed because of an excess of positive charge in dielectric layers could not electrically contact the source region 6B due to the heavy doping of the cut-off layer 41 surrounding it and preventing conductive channels from being formed around the source region 6B.

It is also worth noting that the cut-off layer 41 extends to the gate region 7 so as to cut off the possible formation of channels or leakage in the dielectric-well side interface region underlying the channel active region 42. However this cut-off layer 41 is not integrated around the drain region 6A, saving thus a considerable integration area. Particularly, the integrated structure 40 according to the invention is not forced to comply with the constraint concerning the distance to be kept between the drain region 6A and the cut-off layer as seen in known approaches (function of the desired nominal breakdown voltage to be obtained for the NMOS component). Moreover, eliminating part of the cut-off layer further reduces the integrated structure 40 size.

On the contrary, advantageously according to the invention, the cut-off layer integrated around and electrically in contact only with the source region 6B does not impose any constraint in terms of distance to be kept from the source region 6B which is at the same potential as the dielectrically insulated well 3. The integrated structure 40 according to the invention is thus extremely compact, though ensuring the complete dielectric insulation of the NMOS component formed therein with respect to components out of the dielectrically insulated well 3 and mainly the cut-off of possible leakage currents between drain and source regions 6A and 6B.

The integrated structure 40 according to the invention is formed through an integration process including the following steps. An SOI substrate is formed starting from an N-substrate 1 (commonly indicated as "handle-wafer"), a buried oxide region 2 (commonly indicated as BOX or "buried oxide") and an N type region 4 (commonly indicated with "device-wafer or SOI"). The side insulating structure of the well 3 is defined and integrated in the SOI substrate through dielectric trench 5 integration. Particularly, the step of defining and integrating dielectric trenches 5 comprises, conventionally, the steps of hardmasking, masking, hardmask etching, silicon etching (trench), oxidizing the trench side surface or dielectric depositing on the side surface 12, and filling the trench 5 with some filler 13.

The dielectrically insulated well 3 is formed through the masking, development and implant (of the P type, for example boron) and diffusion steps. It is worth noting that at the end of the diffusion step, the well P-region (p-well) will be delimited by dielectric trenches 5. If the NMOS component belongs to a set of components forming a BiCMOS technology and bipolar components are thus also present, the P-well 3 will actually be composed of two overlapped P-regions, i.e. the P-region formed in this step (commonly indicated with p-well surface region) and a buried P-region (commonly indicated with p-buried or bulk region and usually used to form the collector terminal of vertical PNP components). In fact in the case of BiCMOS technologies the SOI substrate ("device wafer") is composed of two adjacent N-regions, the first region being defined when forming the layer consisting of handle-wafer, BOX and SOI substrate, and the second being defined through an epitaxial process growing the SOI layer thickness until the nominal value required by the specifications provided in the given technology.

It is worth noting that, before performing the growing step of the SOI substrate thickness, the buried P-layer is formed through a masking, implant and diffusion process. The overlap of the p-well and p-buried regions is suggested to ensure that the inner part of the trench-delimited well is entirely of the P-type. The presence of residual bulk N-regions would instead ease the formation of undesired bulk conduction channels F between the source and drain regions.

The NMOS component active region is defined through a LOCOS (local oxidation) process to form the thick oxide 8, performed conventionally through the steps of growing a thin oxide, growing a nitride layer, photomasking, nitride layer etching and oxidation, removing the residual nitride and the underlying oxidine. It is worth noting that for integrating the NMOS component the active area definition is actually not necessary since dielectric trenches 5 serve also as self-aligning layer for defining the next layers. Nevertheless, as it usually happens, the NMOS component can belong to a set of components forming a BiCMOS technology in which the active area definition is however advisable.

The gate region 7 is defined by growing a gate oxide (thin as well), depositing a gate polysilicon layer, photomasking and etching (for defining the gate region 7). During this step, spacer regions are formed (with reference to the voltage class whereto the NMOS component to be formed refers) through a dielectric deposition and etching process.

Advantageously according to the invention, the integration process of the integrated structure 40 also includes forming drain 6A and source 6B regions through a high N-dopant dose photomasking, developing and implanting process, the source region 6B resulting from an asymmetric masking with respect to the gate region 7 and thus not specular to the drain region 6A (as it happens instead in prior art solutions). It is also worth noting that the N-implant step, effective to define the drain region 6A, is self-aligned by the gate region 7 along the whole gate region itself. On the contrary, for the source region 6B, this N-implant step is self-aligned by the gate region 7 on one side and by the masking resist on the other three sides of the source region 6B. Moreover, the N-implant defining the source and drain regions serves also as dopant of the gate polysilicon layer, after the masking and development step the gate region 7 is purposely exposed to this implant.

Advantageously according to the invention, the integration process of the integrated structure 40 finally comprises a step of forming the cut-off layer 41 comprising, conventionally, a high P-dose photomasking, development and implant step. A "C"-shaped layer is thus obtained, which surrounds the source region 6B and makes it electrically insulated from dielectric trenches 5 surrounding the insulation well 3. It is worth noting that the P-layer 41 surrounding the source region 6B, according to the invention, allows simultaneously the bulk contact (or ground contact of the well 3) of the NMOS component.

The integration process is thus completed, according to traditional manufacturing criteria, through the steps of forming contact regions, metallization layers 10, the passivation layer, as well as photomasking and etching steps for defining bias pads completing the NMOS device according to the invention.

Figure 5A:
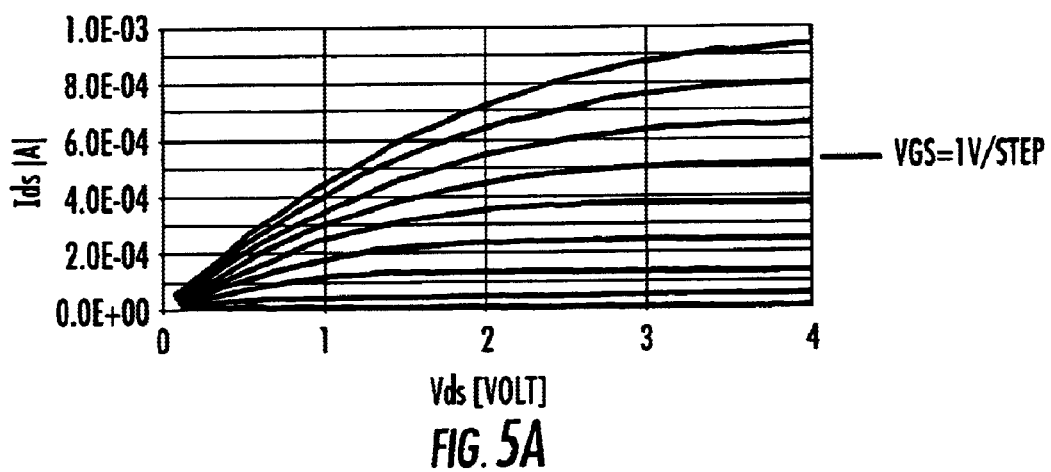
FIGS. 5A–5D are graphs showing the trend of typical parameters of the integrated structure of FIGS. 4A and 4B.
Figure 5B:
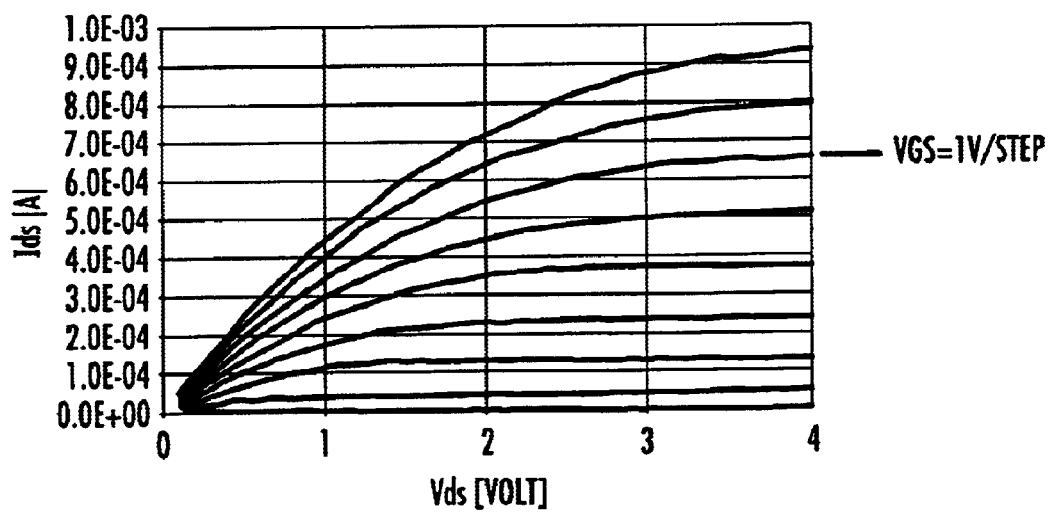

Operation tests of the integrated structure 40 according to the invention and comparison tests between this structure and a prior art structure have been performed. Particularly, FIGS. 5A and 5B respectively show the DC electric features and the breakdown curve of a prior art integrated NMOS component in a dielectrically insulated well 3 without cut-off structures. It can be immediately noticed that for these output features of FIG. 5A, as well as for the breakdown curve of FIG. 5B, at a void value of the gate voltage a current flows between the source and drain regions: this current Ids is thus not void because of the presence of the undesired parasitic conductive paths.

Figure 5C:
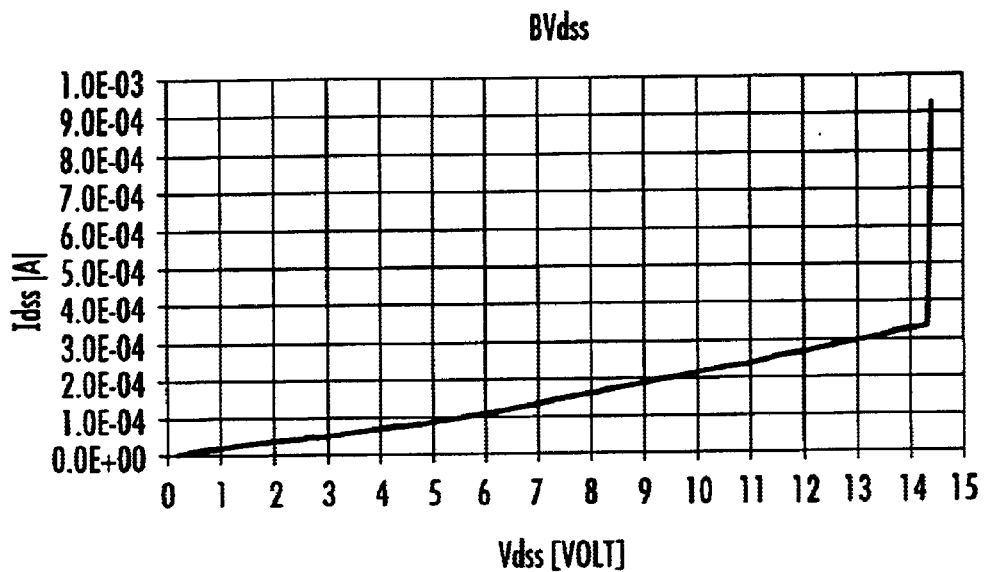
Figure 5D:
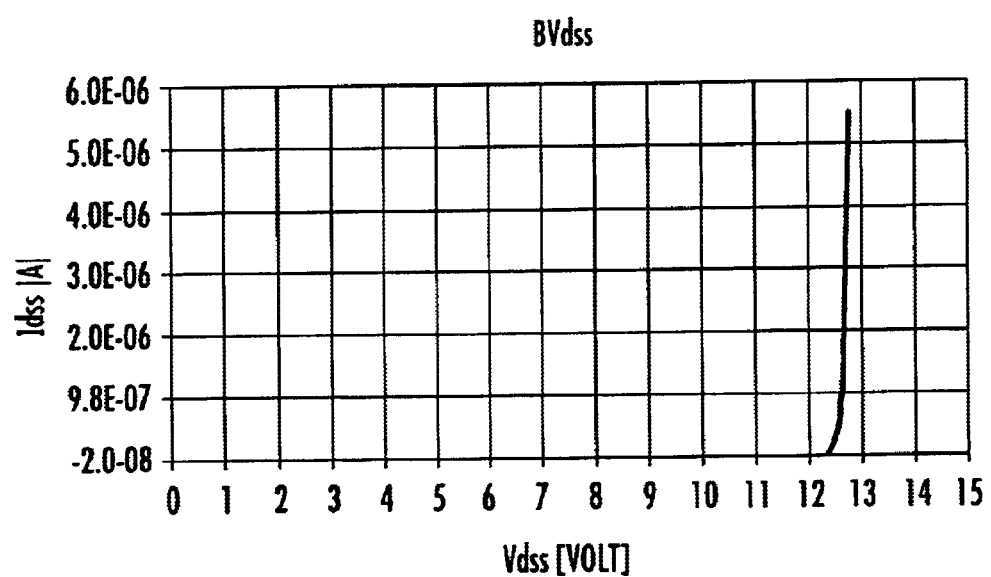

Similarly, FIGS. 5C and 5D show the DC electric features and the breakdown curve of the integrated NMOS component according to the invention, i.e. via an integrated structure 40 as shown in FIGS. 4A and 4B. In this case, both for the output features of FIG. 5C and for the breakdown curve of FIG. 5D, it happens that at a void value of the gate voltage current does not flow between the source and drain regions; the current Ids is void.

It is worth emphasizing that the presence of the cut-off layer 41 implies that a real channel width WE of the so-formed NMOS component is slightly smaller than the potentially achievable width on the drain region 6A side: particularly, the real channel width WE is decreased by twice the cut-off layer 41 width. This difference is however negligible when the channel width itself increases. To form, via the integrated structure 40 according to the invention, an NMOS component having a particular equivalent switch-on resistance (Ron), the size thereof must be conveniently increased so as to obtain the desired channel width with respect to a prior art integrated structure equipped for example with a ring cut-off region 14 around the active area. It can be immediately verified that in this case the use of the integrated structure 40 according to the invention involves however a considerable integration area reduction with respect to the prior art.

Figure 1A:
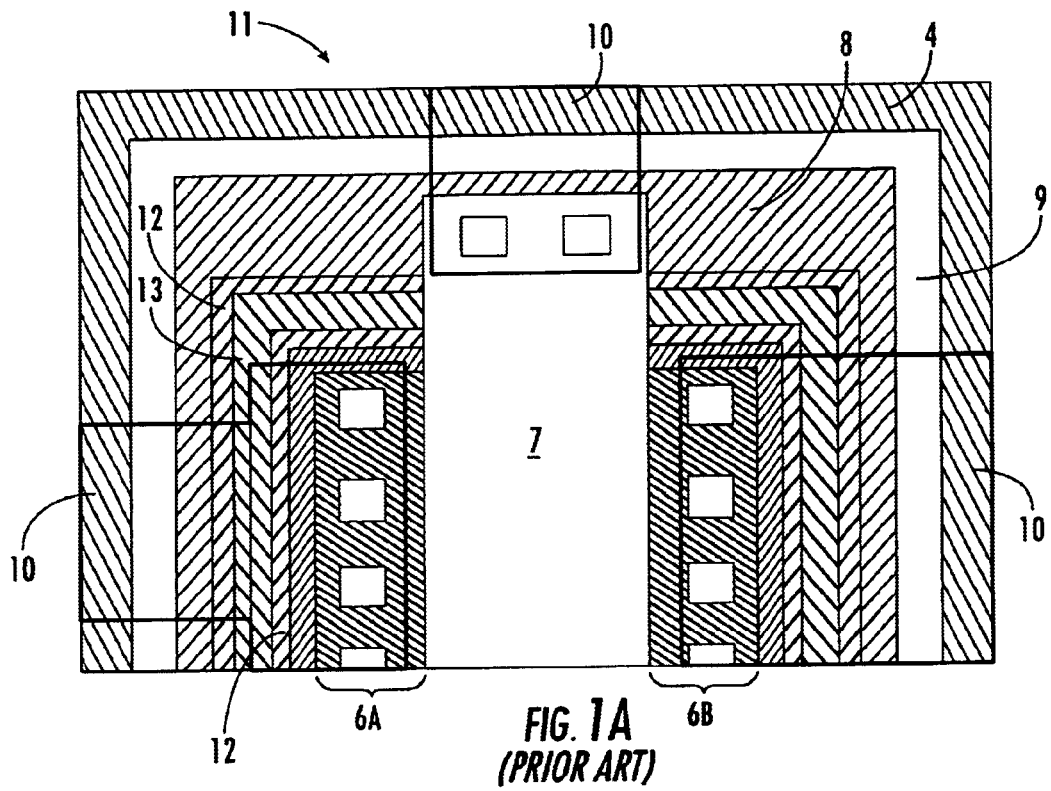
FIGS. 1A and 1B are schematic integration layout and corresponding cross-sectional views respectively showing an integrated structure forming an NMOS component in a dielectrically insulated well according to the prior art.
Figure 1B:
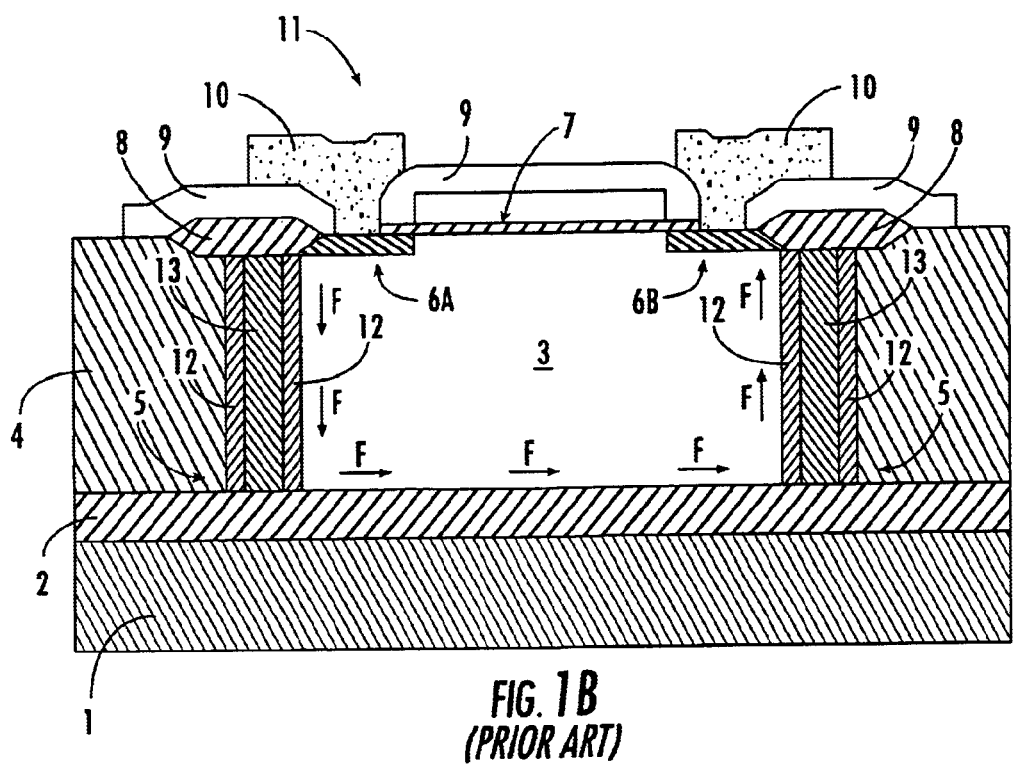
Figure 2A:
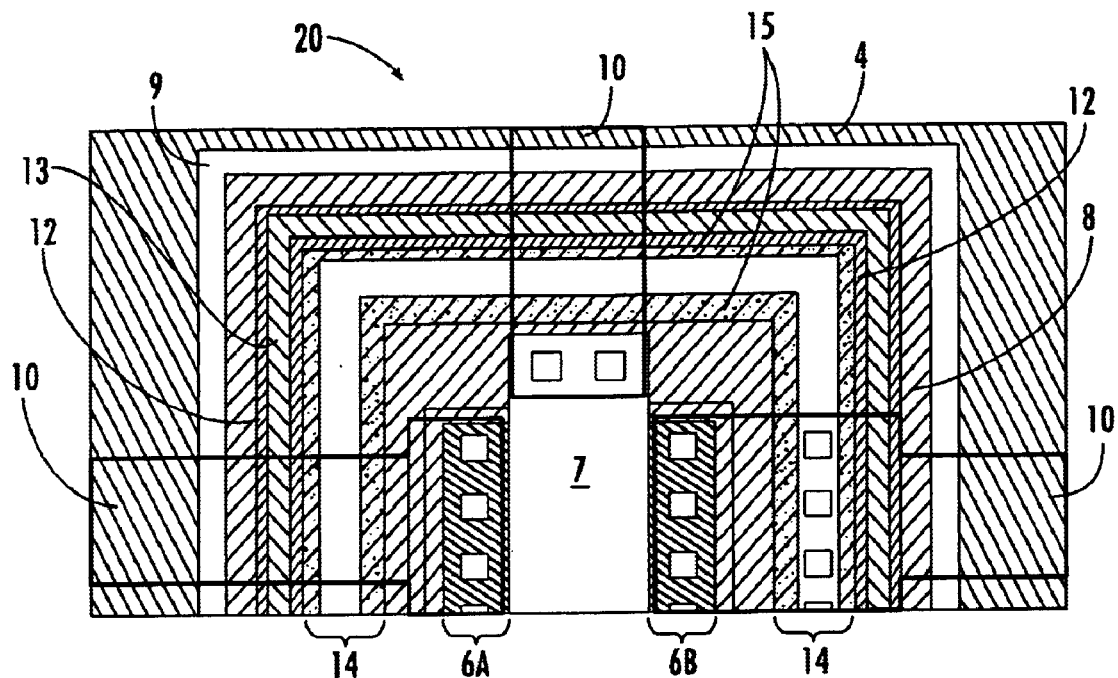
FIGS. 2A and 2B are schematic integration layout and corresponding cross-sectional views respectively showing an integrated structure forming an NMOS component in a dielectrically insulated well according to an alternative prior art embodiment.
Figure 2B:
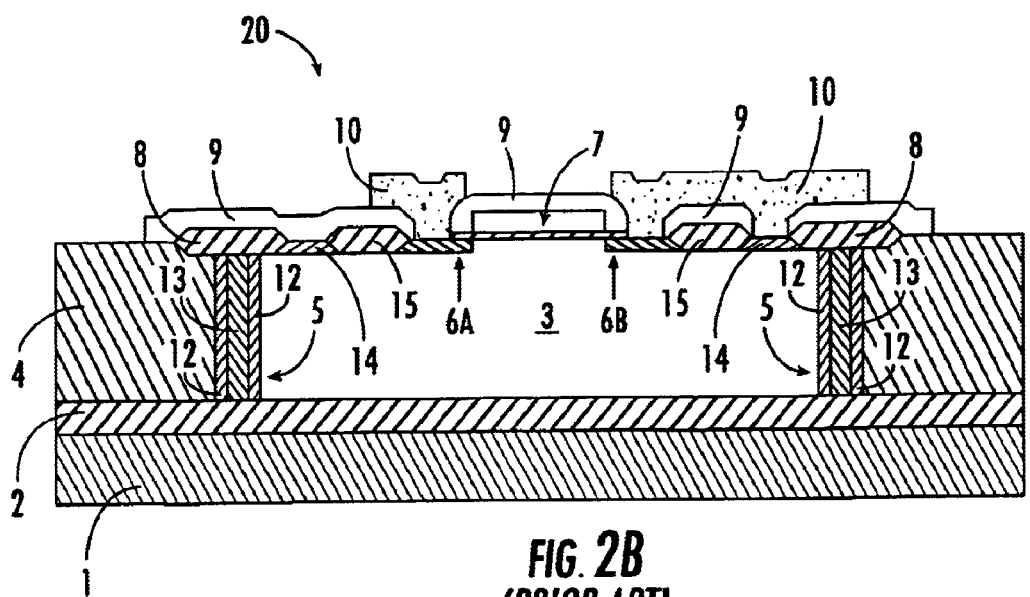
Figure 3A:
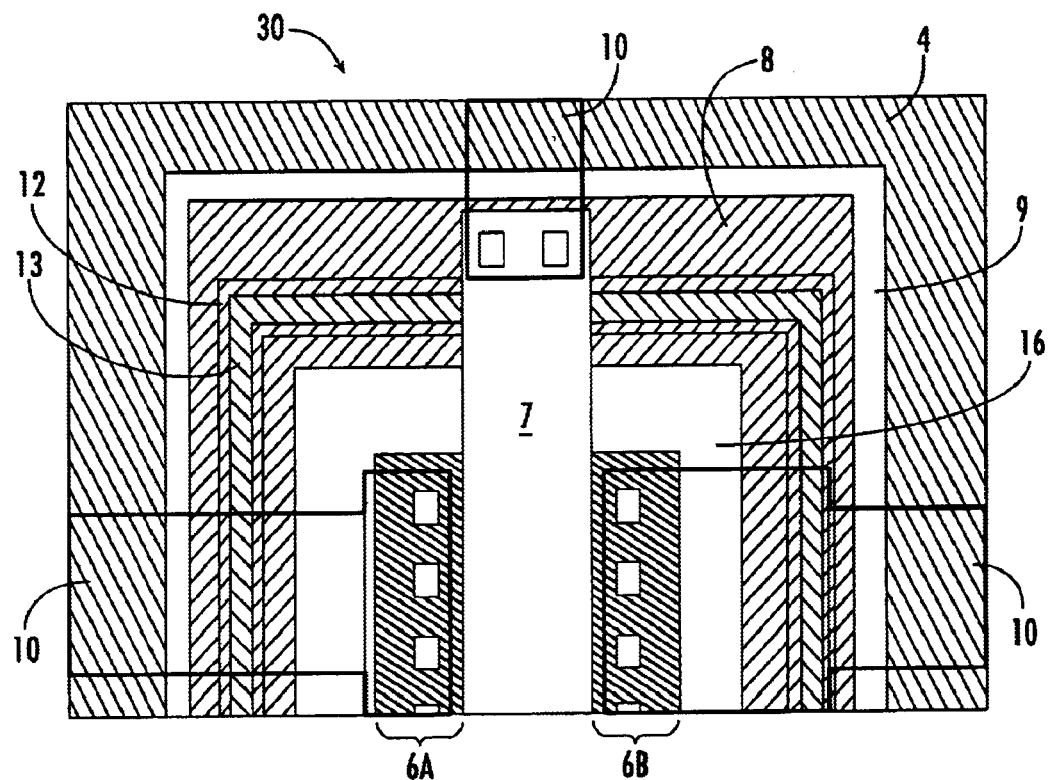
FIGS. 3A and 3B are schematic integration layout and corresponding cross-sectional views respectively showing an integrated structure forming an NMOS component in a dielectrically insulated well according to a further alternative prior art embodiment.
Figure 3B:
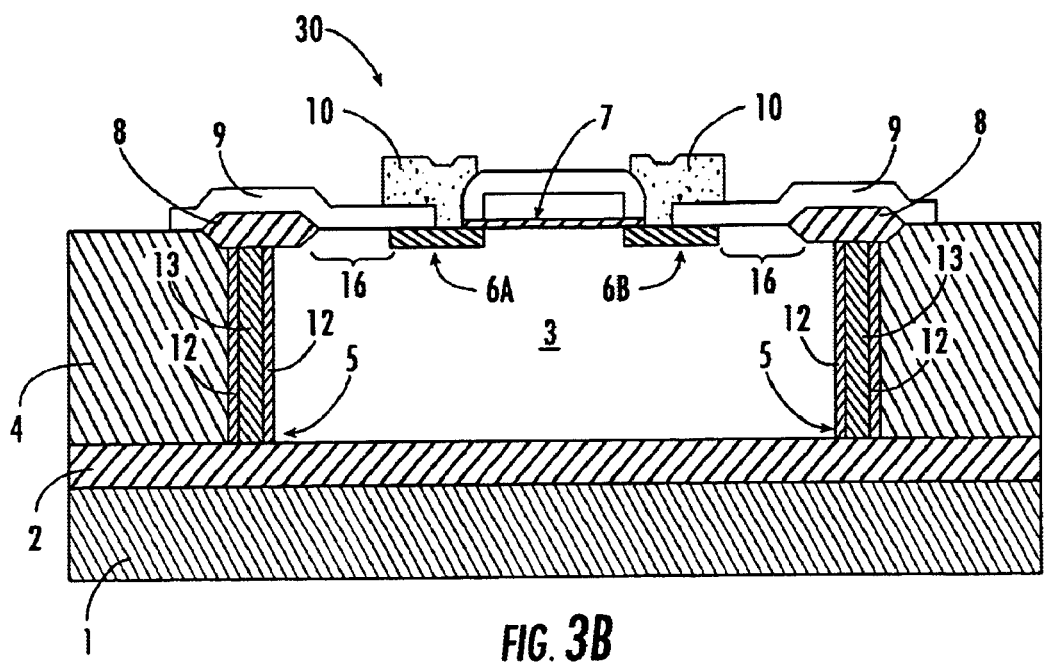
Figure 6:
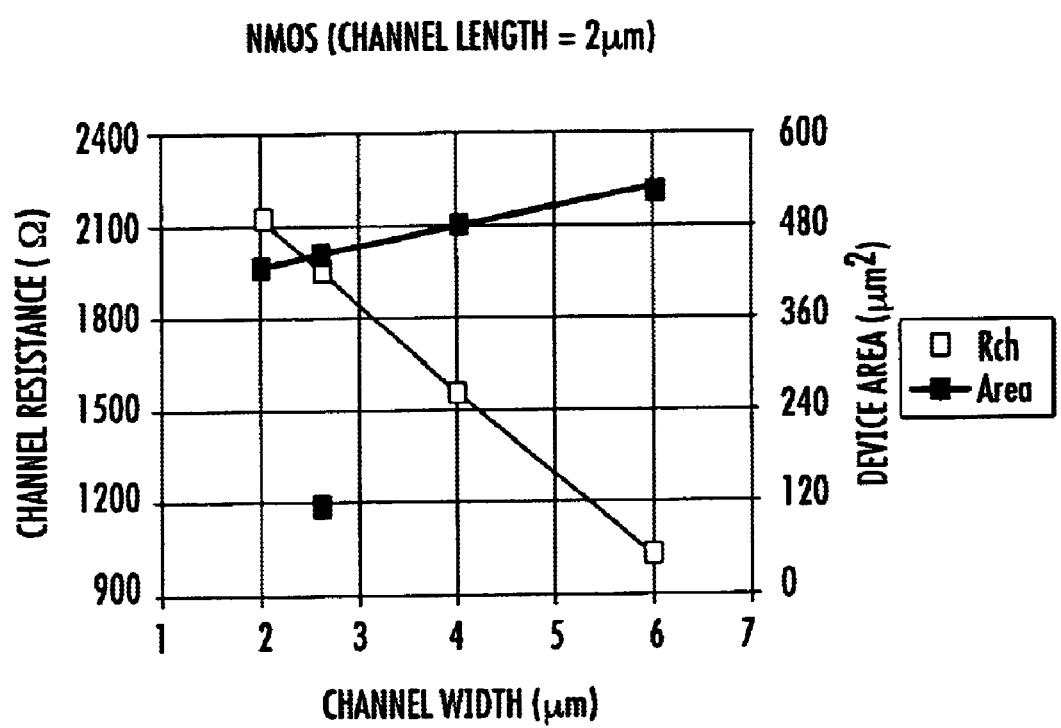
FIG. 6 is a graph showing the comparison between the overall area of NMOS components according to the prior art and to the present invention.

The graph of FIG. 6 results from tests, which represents the variation of the channel resistance and overall area of four prior art NMOS components comprising a ring cut-off region 14 all around the NMOS component active area (as shown for example in FIGS. 2A and 2B), when the channel width Wch varies, particularly for Wch=2.0, 4.0 and 8.0 microns. The same graph of FIG. 6 also shows the value of the overall area of an NMOS component formed via an integrated structure 40 according to the invention, having a channel width Wch=2.6 microns and a channel resistance being equivalent to the prior art NMOS component having as well a channel width Wch=2.6 microns. All five components being analyzed have a channel length Lch=2 microns and they have been drawn keeping the same layout rules.

It can be immediately verified from the graph of FIG. 6 that, for an equal channel resistance (and thus of Lch and Wch), the NMOS component formed via an integrated structure 40 according to the invention occupies an overall area being about four times lower than an equivalent NMOS component according to the prior art. In conclusion, the presence of the cut-off layer 41 around the source region 6B involves a negligible area occupation with respect to the case of the NMOS component formed instead conventionally with a ring cut-off region 14 all around the component active area which considerably damages the occupation area.

Finally, differently from prior art integrated structures, the integrated structure 40 according to the invention does not involve any manufacturing constraints of the structure forming the gate terminal. In fact, being that the contact region of the gate terminal is formed on thick oxide out of the active area, the integrated structure 40 according to the invention allows CMOS integrated components to be formed conventionally, without resorting to particular layout constraints.

That which is claimed is:

1. An integrated structure comprising:
a dielectrically insulated well; and
a MOS component in the insulated well and comprising
respective drain and source regions having a first conductivity type,
a gate region,
a cut-off layer having a second conductivity type and laterally surrounding only the source region on three sides thereof, the cut-off layer being self-aligned by the gate region.

2. An integrated structure according to claim 1, further comprising a channel active region between the drain and source regions, wherein the cut-off layer is self-aligned with respect to the channel active region.

3. An integrated structure according to claim 1, wherein the dielectrically insulated well comprises dielectric trenches, and the cut-off layer is in direct contact with the dielectric trenches to completely insulate the source region.

4. An integrated structure according to claim 3, wherein the cut-off layer comprises a relatively heavily doped cut-off layer.

5. An integrated structure according to claim 1, wherein the cut-off layer is integrated in direct contact with the source region to define a bulk contact for the MOS component.

6. An integrated structure according to claim 1, wherein the MOS component is of the N type, the first conductivity type is the N type, and the second conductivity type is the P type.

7. An integrated structure comprising:
an insulated well; and a MOS component in the insulated well and comprising respective drain and source regions having a first conductivity type,
a gate region,
a cut-off layer having a second conductivity type and laterally surrounding the source region on three sides thereof opposite the gate region.

8. An integrated structure according to claim 7, further comprising a channel active region between the drain and source regions, wherein the cut-off layer is self-aligned with respect to the channel active region.

9. An integrated structure according to claim 7, wherein the insulated well comprises dielectric trenches, and the cut-off layer is in direct contact with the dielectric trenches to completely insulate the source region.

10. An integrated structure according to claim 7, wherein the cut-off layer is integrated in direct contact with the source region to define a bulk contact for the MOS component.

* * * * *

UNITED STATES PATENT AND TRADEMARK OFFICE
CERTIFICATE OF CORRECTION

PATENT NO. : 6,900,504 B2
DATED : May 31, 2005
INVENTOR(S) : Leonardi

It is certified that error appears in the above-identified patent and that said Letters Patent is hereby corrected as shown below:

Title page,
Item [75], Inventors, delete "Antonio (IT)" insert -- Aci-S. Antonio (CT) (IT) --.
Item [73], Assignee, insert -- (MI) -- before "(IT)".

Column 3,
Line 5, delete "SO" insert -- SOI --.

Signed and Sealed this

Sixth Day of September, 2005

JON W. DUDAS
*Director of the United States Patent and Trademark Office*